(12) United States Patent
Kim et al.

(10) Patent No.: US 7,973,606 B2
(45) Date of Patent: Jul. 5, 2011

(54) FRACTIONAL-N FREQUENCY SYNTHESIZER AND METHOD THEREOF

(75) Inventors: Yoo Hwan Kim, Yongin-si (KR); Yoo Sam Na, Seoul (KR); Byeong Hak Jo, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 51 days.

(21) Appl. No.: 12/563,903

(22) Filed: Sep. 21, 2009

(65) Prior Publication Data

US 2010/0321120 A1 Dec. 23, 2010

(30) Foreign Application Priority Data

Jun. 23, 2009 (KR) ........................ 10-2009-0056067

(51) Int. Cl.
*H03L 7/06* (2006.01)
*H03L 7/08* (2006.01)
*H03L 7/085* (2006.01)
*H03L 7/087* (2006.01)
*H03L 7/18* (2006.01)

(52) U.S. Cl. ................ 331/12; 331/1 A; 331/16; 331/17; 331/25

(58) Field of Classification Search .................. 331/1 A, 331/10–12, 16–18, 25; 327/156–159; 332/127; 360/51; 375/376; 455/260
See application file for complete search history.

(56) References Cited

U.S. PATENT DOCUMENTS

| 7,636,018 | B2 * | 12/2009 | Chang et al. | .................... 331/12 |
| 2008/0224789 | A1 * | 9/2008 | Chang et al. | .................. 332/127 |
| 2010/0225361 | A1 * | 9/2010 | Rhee et al. | .................... 327/105 |
| 2010/0329388 | A1 * | 12/2010 | Ko | ................. 375/300 |

FOREIGN PATENT DOCUMENTS

KR 10-2006-0091145 A 8/2006

* cited by examiner

*Primary Examiner* — David Mis
(74) *Attorney, Agent, or Firm* — Lowe, Hauptman, Ham & Berner, LLP

(57) ABSTRACT

The present relates to a fractional-N frequency synthesizer improving noise characteristics and a method thereof. The fractional-N frequency synthesizer includes a reference oscillator that generates a reference frequency signal; a sigma-delta modulator that generates a desired decimal value based on the reference frequency signal; a divider that divides a voltage controlled oscillation frequency signal; first to M phase/frequency detectors that detect a difference in phase and frequency between the reference frequency signal and the divided voltage controlled oscillation frequency signal; first to M charge pumps that are connected to each of the phase/frequency detectors in series and charges or pumps charge amount according to output signals from each of the phase/frequency detectors; a loop filter that controls the amount of supplied current based on output signals from the charge pumps to filter low-pass frequency components; and a voltage controlled oscillator that is oscillated in response to the output signal from the loop filter and generates voltage controlled oscillation frequency signals.

8 Claims, 4 Drawing Sheets

[FIG. 1]
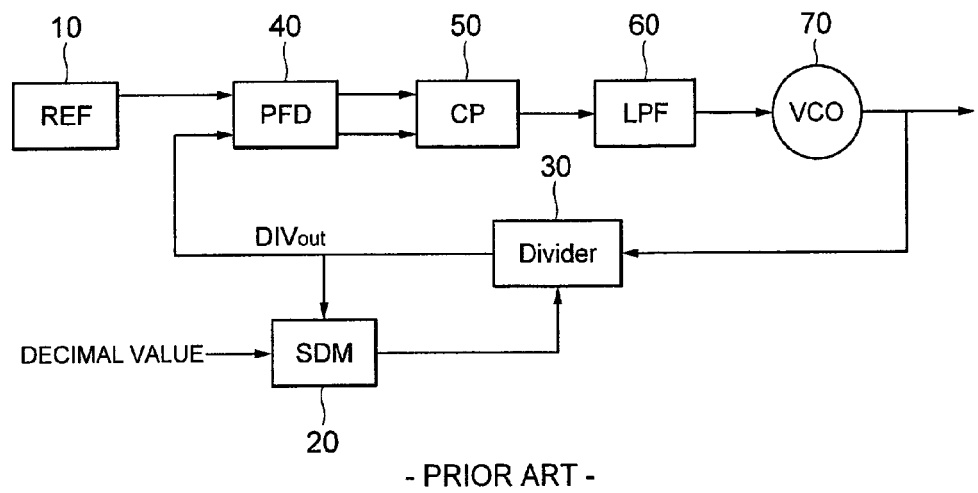
- PRIOR ART -
[FIG. 2]
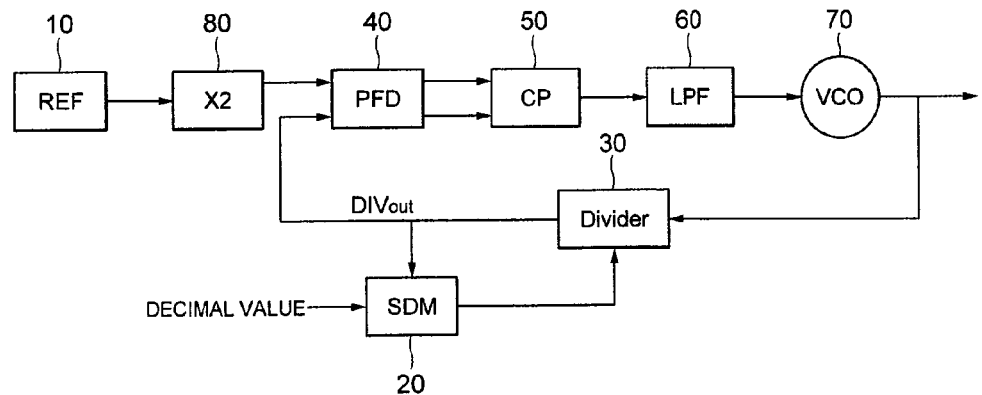
- PRIOR ART -

[FIG. 3]
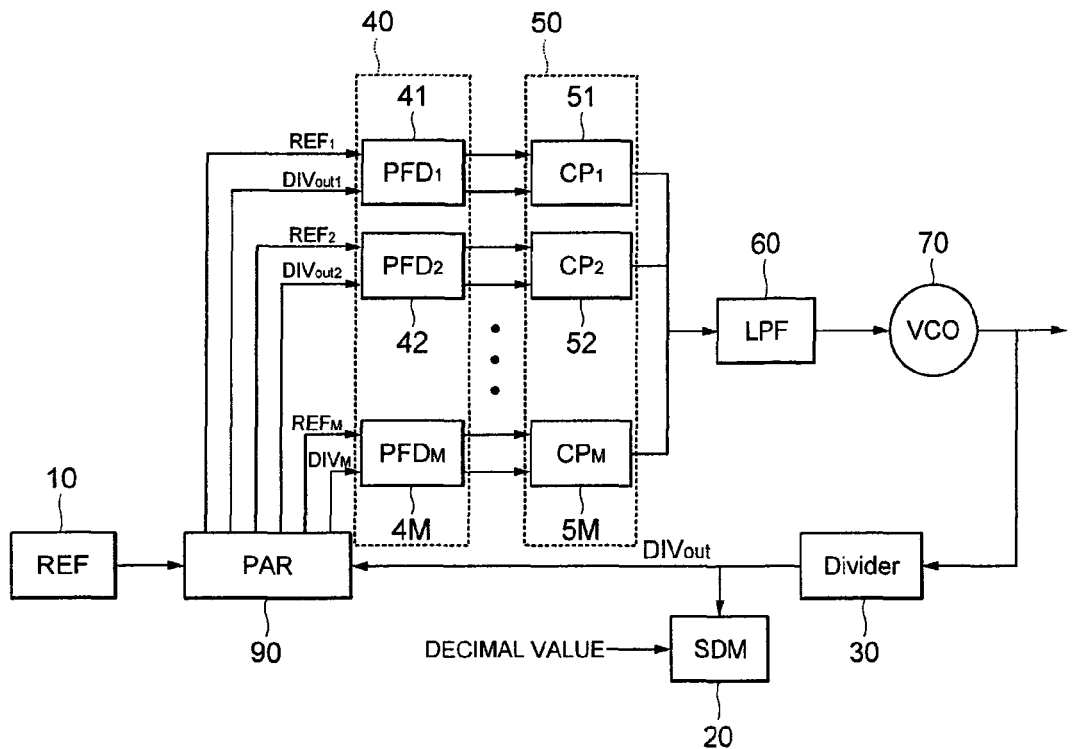
[FIG. 4]
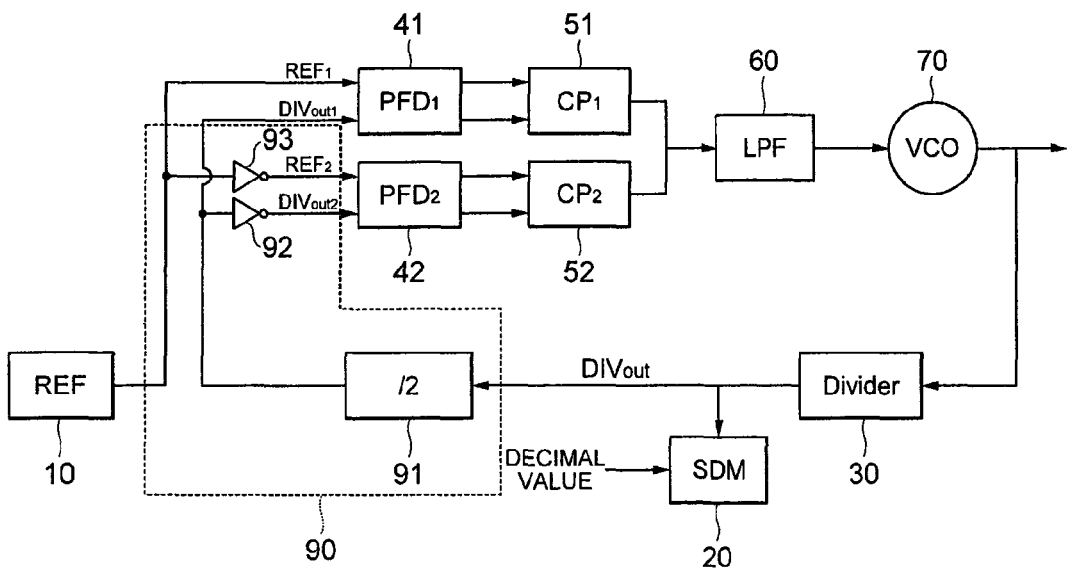

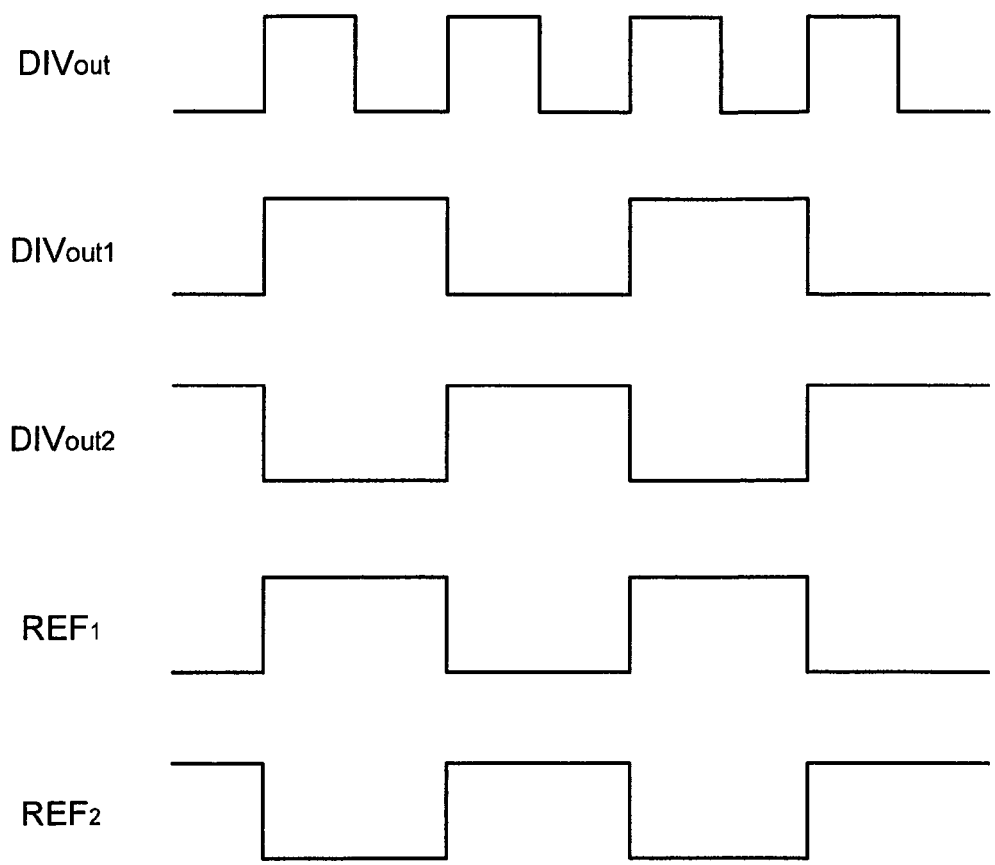
[FIG. 5]

[FIG. 6]
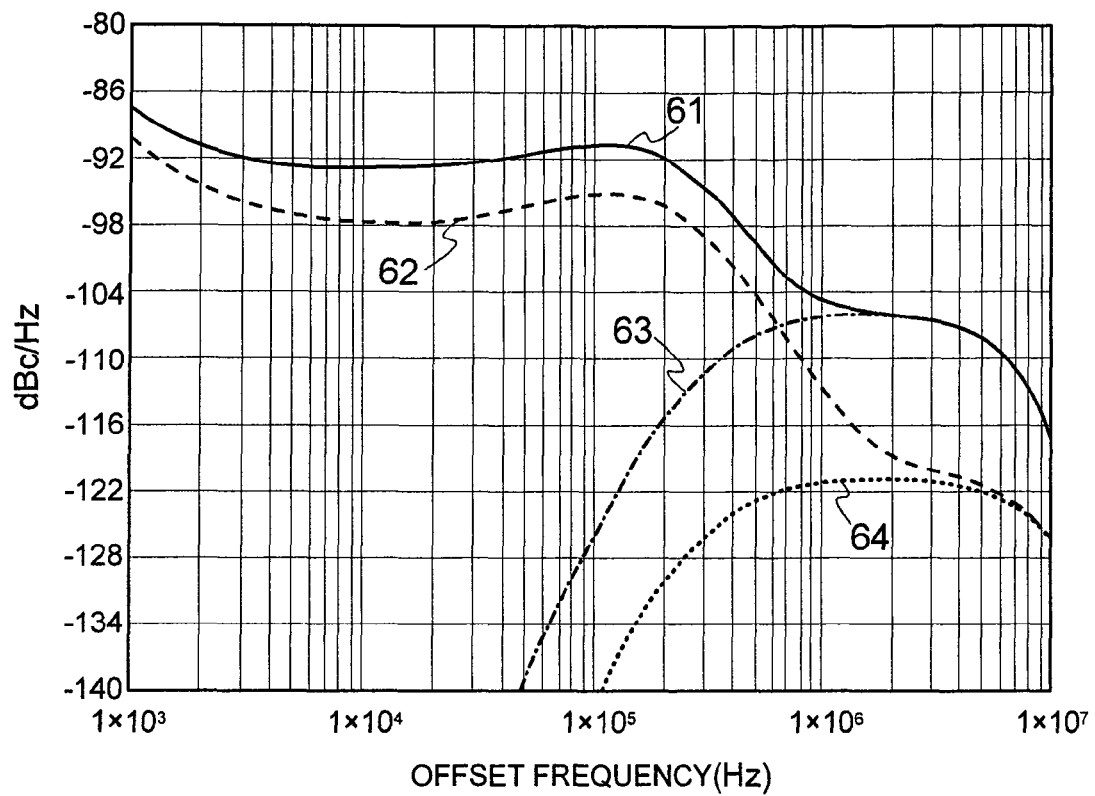

FRACTIONAL-N FREQUENCY SYNTHESIZER AND METHOD THEREOF

CROSS REFERENCES RELATED APPLICATIONS

The present application claims priority under 35 U.S.C. 119 and 35 U.S.C. 365 to Korean Patent Application No. 10-2009-0056067 (filed on Jun. 23, 2009), which is hereby incorporated by reference in its entirety.

BACKGROUND OF THE INVENTION

1. Field of the Invention

The present invention relates to a fractional-N frequency synthesizer improving noise characteristics and a method thereof, and in particular, to a fractional-N frequency synthesizer capable of improving in-band noise while out-band pushing quantization noise occurring in a sigma-delta modulator by substantially increasing a clock frequency M times using M phase/frequency detectors and M charge pumps instead of increasing a clock frequency of the sigma-delta modulator M times and a method thereof.

2. Description of the Related Art

A frequency synthesizer is essentially used in a wireless communication system to obtain a channel frequency required for a receiver and a transmitter as well as in devices using frequency. The frequency synthesizer generates a desired channel frequency in a manner that a phase of a frequency signal of a predetermined reference frequency 'fref' is compared with a phase of a frequency signals generated by dividing an oscillation frequency of a voltage controlled oscillator by a required division ratio by using a phase locked loop (PLL).

As the dividing schemes of the phase locked loop, there are an integer-N scheme and a fractional-N scheme. The fractional-N scheme is a scheme that can divide the oscillation frequency of a voltage controlled oscillator by a division ratio having a fractional value.

In order to make a lock time and a phase noise good, the fractional-N frequency synthesizer should use a wide closed loop bandwidth. However, in order to generate the desired frequency, a decimal value is needed, which is obtained by using a sigma-delta modulator. The sigma-delta modulator causes a further noise called quantization noise. The entire phase noise performance is degraded due to the quantization noise. Therefore, in order to reduce the quantization noise, the related art used a method of reducing the closed loop bandwidth or increasing the clock frequency of the delta-sigma modulator.

FIG. 1 is a block diagram showing a fractional-N frequency synthesizer according to the related art. The fractional-N frequency synthesizer according to the related art includes a reference oscillator 10, a sigma-delta modulator 20, a divider 30, a phase/frequency detector 40, a charge pump 50, a loop filter 60, and a voltage controlled oscillator 70.

First, in the fractional-N frequency synthesizer according to FIG. 1, when the closed loop bandwidth is reduced, the quantization noise of the sigma-delta synthesizer is pushed to out-band. This characteristic can reduce the quantization noise outside the loop bandwidth due to the low-pass characteristic of the phase locked loop (PLL). However, when the bandwidth is wide, the quantization noise is added to the output of the frequency synthesizer to degrade the entire noise characteristics, such that there is a problem in that the quantization noise, which is the out-band noise source, becomes a dominant noise source of the entire fractional-N frequency synthesizer.

Meanwhile, FIG. 2 is a block diagram showing the fractional-N frequency synthesizer according to the related art that increases the clock frequency in order to reduce the quantization noise of the fractional-N frequency synthesizer according to the related art.

The fractional-N frequency synthesizer according to FIG. 2 further includes an incremental device 80, which increases a reference frequency signal twice, in addition to the frequency synthesizer according to FIG. 1. In order to reduce the quantization noise, the method of increasing the clock frequency of the sigma-delta modulator increases the reference frequency signal twice and increases the clock of the sigma-delta modulator twice, such that the quantization noise is shifted to the out-band and the noise is reduced due to the low-pass characteristic of the PLL.

However, when the reference frequency signal, which is the input signal of the phase/frequency detector, is increased M times, the in-band phase noise of the PLL is increased by 10 log(M). In addition, when the reference frequency signal is increased M times, the value of the divider 30 is reduced M times, such that the in-band phase noise is reduced by 20 log(M). In other words, when the reference frequency signal is increased M times, it is limited to 10 log(M). In addition, there is a problem in that the noise in a circuit that increases the reference frequency signal twice increases the in-band noise.

SUMMARY OF THE INVENTION

In order to solve the above problems, an object of the present invention provides a fractional-N frequency synthesizer capable of improving in-band noise while out-band pushing quantization noise occurring in a sigma-delta modulator by substantially increasing a clock frequency M times using M phase/frequency detectors and M charge pumps instead of increasing a clock frequency of the sigma-delta modulator M times and a method thereof.

In order to achieve the above object, there is provided a fractional-N frequency synthesizer improving noise characteristics according to the present invention, including: a reference oscillator that generates a reference frequency signal; a sigma-delta modulator that generates a desired decimal value based on the reference frequency signal; a divider that divides a voltage controlled oscillation frequency signal; first to M phase/frequency detectors that detect a difference in phase and frequency between the reference frequency signal and the divided voltage controlled oscillation frequency signal; first to M charge pumps that are connected to each of the phase/frequency detectors in series and charges or pumps charge amount according to output signals from each of the phase/frequency detectors; a loop filter that controls the amount of supplied current based on output signals from the charge pumps to filter low-pass frequency components; and a voltage controlled oscillator that is oscillated in response to the output signal from the loop filter and generates voltage controlled oscillation frequency signals.

Preferably, the fractional-N frequency synthesizer further includes a phase controller that divides the divided voltage controlled oscillation frequency signal by 1/M times, controls each phase thereof, and then supplies them to each of the first to M phase/frequency detectors.

Preferably, the phase controller controls the phases of the reference frequency signals, respectively, and supplies them to each of the first to M phase/frequency detectors.

Preferably, the phase controller controls each of the phases of the reference frequency signals to $$\frac{(A-1)360°}{A}$$

(where, A is an integer from 1 to M) and supplies them to the A phase/frequency detector.

Further, when the M is 2, the phase controller further includes a flip flop circuit that divides the divided voltage controlled oscillation frequency signal by ½; a first inverter that inverts the phase of the reference frequency signal; and a second inverter that inverts the phase of the divided voltage controlled oscillation frequency by ½ by the flip flop circuit.

Meanwhile, there is provided a fractional-N frequency synthesizing method improving noise characteristics according to the present invention, including: a) oscillating a reference frequency that generates a reference frequency signal; b) performing sigma-delta modulation that generates a desired decimal value based on the reference frequency signal; c) dividing the voltage controlled oscillation frequency signal; d) detecting a difference in phase and frequency between the reference frequency signal and the divided voltage controlled oscillation frequency signal by first to M phase/frequency detector; e) charging or pumping charge amount by first to M charge pumps, which are connected to each of the phase/frequency detectors in series, according to output signals from each of the phase/frequency detectors; f) filtering low-pass frequency component by controlling the amount of supplied current by a loop filter, based on output signals from the charge pumps; and g) generating voltage controlled oscillation frequency signals oscillated in response to the output signal from the loop filter by the voltage controlled oscillator.

Preferably, after step c), the fractional-N frequency synthesizing method further includes c1) controlling an oscillation frequency phase that divides the divided voltage controlled oscillation frequency signal by 1/M times, controls each phase thereof, and then supplies them to each of the first to M phase/frequency detectors.

Preferably, the step c1) further includes controlling a reference frequency phase that controls the phases of the reference frequency signals, respectively, and supplies them to each of the first to M phase/frequency detectors.

Preferably, the controlling the reference frequency phase controls each of the phases of the reference frequency signals to $$\frac{(A-1)360°}{A}$$

(where, A is an integer from 1 to M) and supplies them to the A phase/frequency detector.

Further, when the M is 2, the controlling the oscillation frequency phase divides the divided voltage controlled oscillation frequency signal by ½ and supplies it the first phase/frequency detector and inverts a phase of a signal that divides the divided voltage controlled oscillation frequency signal by ½ and supplies it to the second phase/frequency detector; the controlling the reference frequency phase supplies the reference frequency signal to the first phase/frequency detector and inverts the phase of the reference frequency signal and supplies it to the second phase/frequency detector.

The present invention provides the fractional-N frequency synthesizer capable of improving in-band noise while out-band pushing the quantization noise occurring in the sigma-delta modulator by substantially increasing the clock frequency M times using M phase/frequency detectors and M charge pumps instead of increasing the clock frequency of the sigma-delta modulator M times and the method thereof.

BRIEF DESCRIPTION OF THE DRAWINGS

FIG. 1 is a block diagram showing a fractional-N frequency synthesizer according to the related art;

FIG. 2 is a block diagram showing the fractional-N frequency synthesizer according to the related art that increases the clock frequency in order to reduce the quantization noise of the fractional-N frequency synthesizer according to the related art;

FIG. 3 is a block diagram showing a fractional-N frequency synthesizer improving noise characteristics according to the present invention;

FIG. 4 is a block diagram showing the fractional-N frequency synthesizer according to one embodiment of the present invention;

FIG. 5 is a timing diagram showing each signal shown in the fractional-N frequency synthesizer according FIG. 4; and FIG. 6 is a graph showing the comparison result of the noise characteristics of the frequency synthesizer of the related art according to FIG. 1 and the fractional-N frequency synthesizer of the present invention according to FIG. 4.

DESCRIPTION FOR KEY ELEMENTS IN THE DRAWINGS

10: REFERENCE OSCILLATOR
20: SIGMA-DELTA MODULATOR
30: DIVIDER
40: PHASE/FREQUENCY DETECTOR
41 TO 4M: FIRST TO M PHASE/FREQUENCY DETECTOR
50: CHARGE PUMP
51 TO 5M: FIRST TO M CHARGE PUMP
60: LOOP FILTER
70: VOLTAGE CONTROLLED OSCILLATOR
90: PHASE CONTROLLER

DETAILED DESCRIPTION OF THE PREFERRED EMBODIMENTS

The objects and technical configuration of a fractional-N frequency synthesizer and a method thereof according to the present invention will be clearly understood through the detailed description with reference to the accompanying drawings showing exemplary embodiments of the present invention.

Hereinafter, the present invention will be described with reference to the accompanying drawings.

FIG. 3 is a block diagram showing a fractional-N frequency synthesizer improving noise characteristics according to the present invention.

The fractional-N frequency synthesizer improving noise characteristics according to the present invention includes a reference oscillator 10, a sigma-delta modulator 20, a divider 30, first to M phase/frequency detectors 41 to 4M, first to M charge pumps 51 to 5M, a loop filter 60, and a voltage controlled oscillator 70.

The reference oscillator 10 generates reference frequency signals and may be configured of a crystal-oscillator or TCXO. The sigma-delta modulator 20 generates desired decimal values based on the reference frequency signals generated in the reference oscillator 10. The divider 30 divides voltage controlled oscillation frequency signals.

The M phase/frequency detectors 41 to 4M detect a difference in phase and frequency between the reference frequency signal and the divided voltage controlled oscillation frequency signal and are connected to each of the first to M charge pumps (51 to 5M) in series. The M charge pumps 51 to 5M charges or pumps charge amount according to output signals from each of the phase/frequency detectors 41 to 4M (however, it will be apparent to those skilled in the art that M represents a natural number of 2 or more and M value is approximately selected and applied as needed to obtain an effect of increasing the reference frequency signal M times).

The A phase/frequency detector (here, A is an integer that is $1 \leq A \leq M$) compares a phase of $DIV_{outA}$ that is the output signal from the divider 30 and $REF_A$ that is the reference frequency signal and outputs a delta signal corresponding to the difference in phase between two signals. The delta signal generated in the A phase/frequency detector is input to A charge pump and the A charge pump supplies sourcing current or sinking current to a loop filter 60 by the delta signal. The amount of supplied current can be controlled by an external signal.

In order to solve the disadvantages of the method according to the related art that increases the reference frequency signal M times to reduce the quantization noise and to obtain an effect of substantially the reference frequency clock M times without affecting the sigma-delta clock frequency, the fractional-N frequency synthesizer according to the present invention includes the first to M phase/frequency detectors 41 to 4M and the first to M charge pumps 51 to 5M.

Further, in order to synchronize each of the first to M phase/frequency detectors 41 to 4M and each of the first to M charge pumps 51 to 5M, it is preferable that the fractional-N frequency synthesizer further includes a phase controller 90 that divides $DIV_{out}$, which is an output signal from the divider 30, by 1/M times, controls a phase thereof, and supplies $DIV_{out1}$ to $DIV_{outM}$, which are input signals, to each of the first to M phase/frequency detectors 41 to 4M.

In addition, the phase controller 90 controls each of the phases of the reference frequency signals that is generated in the reference oscillator 10 and supplies signals $REF_1$ to $REF_M$ to each of the first to M phase/frequency detectors 41 to 4M. Herein, the phase controller 90 controls each of the phases of the reference frequency signals, to $$\frac{(A-1)360°}{A}$$

and supplies it to the A phase/frequency detector.

By meeting the synchronization, the present invention can substantially obtain the M-fold incremented effect without incrementing the reference frequency signal M times. In other words, the fractional-N frequency synthesizer according to the present invention exhibits the effect that the clock frequency of the sigma-delta divider 20 is substantially increased M times, such that the quantization noise is pushed to out-band and does not increase the input frequencies $DIV_{out1}$ to $DIV_{outM}$ of each of the first to M phase/frequency detectors 41 to 4M, such that the in-band noise is improved and the noise characteristic is entirely improved. According to one embodiment of the present invention, when the clock frequency of the sigma-delta is substantially increased M times using the M phase/frequency detectors and the M charge pumps, the in-band noise improvement of 20 log(M) can be improved and when a third-order sigma-delta modulator is used, the quantization noise characteristic of 40 log (M) can be improved.

Meanwhile, the loop filter 60 controls the amount of supplied current based on the output signal of the M charge pumps 51 to 5M and filters the low-pass frequency component. The voltage controlled oscillator 70 is oscillated in response to the output signal from the loop filter 60 to generate the voltage controlled oscillation frequency signal. Current that is supplied or output to and from the loop filter 60 generates voltage for making a defined output frequency and controls the output from the voltage controlled oscillator 70. Therefore, the voltage controlled oscillator 70 generates the output signal according to the output voltage of the loop filter 60.

FIG. 4 is a block diagram showing the fractional-N frequency synthesizer according to one embodiment of the present invention. The fractional-N frequency synthesizer according to FIG. 4 is the same as the fractional-N frequency synthesizer according to FIG. 3, except that M is 2.

Since M is 2, the clock frequency of the sigma-delta modulator 20 is substantially operated twice of the reference frequency signal. To this end, the fractional-N frequency synthesizer includes the first and second phase/frequency detectors 41 and 42 and the first and second charge pumps 51 and 52.

Moreover, in the fractional-N frequency synthesizer according to FIG. 4, the structure of the phase controller 90 is shown in more detail. The phase controller 90 includes a flip flop circuit 91, a first inverter 92, and a second inverter 93.

The flip flop circuit 91 divides the divided voltage controlled oscillation frequency signal $DIV_{out}$ by 1/2 and supplies the signal $DIV_{out1}$ to the first phase/frequency detector 41. Meanwhile, the reference frequency signal $REF_1$ generated in the reference oscillator 10 is supplied to the first phase/frequency detector 41.

Meanwhile, the first inverter 91 inverts the phase of the signal $DIV_{out1}$ divided by 1/2 by the flip flop circuit 91 and supplies the signal $DIV_{out2}$ to the second phase/frequency detector 42. Further, the second inverter 93 inverts the phase of the reference frequency signal $REF_1$ and supplies the signal $REF_2$ to the second phase/frequency detector 42.

FIG. 5 shows a timing diagram showing the signals $DIV_{out}$, $DIV_{out1}$, $DIV_{out2}$, $REF_1$, and $REF_2$.

For example, when the signal $DIV_{out}$ divided by the divider is 20 Hz at duty 50, the voltage controlled oscillation frequency signal $DIV_{out}$ divided by the flip flop circuit 91 is divided by 1/2, such that the $DIV_{out}$ is equal to the signal $DIV_{out1}$. Therefore, the first phase/frequency detector 41 compares the difference in phase and frequency at the rising edge of the $REF_1$ signal that is the reference frequency signal of 10 Hz and the $DIV_{out1}$ signal.

Meanwhile, the second phase/frequency detector 42 compares the difference in phase and frequency at the rising edge of $DIV_{out2}$ that is a signal inverting the phase of the signal $DIV_{out1}$ by the first inverter 92 and $REF_2$ that is a signal inverting the phase of the reference frequency signal $REF_1$ by the second inverter 93.

In other words, although the first phase/frequency detector 41 is operated at 10 Hz during duty 50 of $DIV_{out}$, since the second phase frequency/detector 42 is operated at 10 Hz during the remaining duty 50 of the $DIV_{out}$ that is not operated by the first phase/frequency detector 41, it substantially has the same out-band pushing effect as one operated at 20 Hz.

Therefore, in the present embodiment, the signal $DIV_{out}$ modulated by the modulator 30 increases twice as large as the reference frequency signal of the reference oscillator 10, such that the quantization noise occurring in the sigma-delta modulator is pushed to out-band and at the same time, the frequency of the reference frequency signals $REF_1$ and $REF_2$ provided to the first and second phase/frequency detectors is not increased, such that the quantization noise occurring in the sigma-delta modulator is pushed to out-band and the in-band noise of the phase/frequency detectors is improved, thereby improving the noise characteristics of the entire fractional-N frequency synthesizer.

Actually, when M is 2, the in-band noise is improved by 20 log(2)=6 dB and the out-band noise is improved by 40 log(2) =12 dB. FIG. 6 is a graph showing the comparison result of the noise characteristics of the fractional-N frequency synthesizer of the related art according to FIG. 1 and the fractional-N frequency synthesizer of the present invention according to FIG. 4 when M is 2.

A graph 61 represents the in-band noise of the fractional-N frequency synthesizer of the related art and a graph 62 represents the in-band noise of the fractional-N frequency synthesizer according to one embodiment (M=2) of the present invention. Further, a graph 63 represents the out-band noise of the fractional-N frequency synthesizer of the related art and a graph 64 represents the out-band noise of the fractional-N frequency synthesizer according to one embodiment (M=2) of the present invention.

In FIG. 6, since one scale of a Y-axis represents 6 dB and a graph 62 is below one scale as compared to a graph 61, it can be appreciated that the in-band noise is actually improved by 6 dB. Further, since a graph 64 is below about two scale as compared to a graph 63, it can be appreciated that the out-band noise is actually improved by 12 dB.

Meanwhile, the fractional-N frequency synthesizing method improving the noise characteristics according to the present invention will be described using FIGS. 3 and 4.

The fractional-N frequency synthesizing method according to the present invention, includes: oscillating a reference frequency that generates a reference frequency signal (step a); performing sigma-delta modulation that generates a desired decimal value based on the reference frequency signal (step b); dividing the voltage controlled oscillation frequency signal (step c); detecting a difference in phase and frequency between the reference frequency signal and the divided voltage controlled oscillation frequency signal (step d) by the first to M phase/frequency detectors 41 to 4M; charging or pumping charge amount by the first to M charge pumps 51 to 5M, which are connected to each of the phase/frequency detectors 41 to 4M in series, according to the output signals from each of the phase/frequency detectors 41 to 4M (step e); filtering low-pass frequency component by controlling the amount of supplied current by the loop filter 60, based on the output signals from the charge pumps 51 to 5M (step f); and generating voltage controlled oscillation frequency signals oscillated in response to the output signal from the loop filter 60 by the voltage controlled oscillator 70 (step g).

Meanwhile, after step c), the fractional-N frequency synthesizing method further includes controlling an oscillation frequency phase that divides the divided voltage controlled oscillation frequency signal by 1/M times, controls each phase thereof, and then supplies them to each of the first to M phase/frequency detectors 41 to 4M (step c1). The phase controlling is performed in the phase controller 90 according to FIG. 3.

The step c1) further includes controlling a reference frequency phase that controls the phases of the reference frequency signals, respectively, and supplies them to each of the first to M phase/frequency detectors 41 to 4M. Further, the controlling the reference frequency phase controls each of the phases of the reference frequency signals to $$\frac{(A-1)360°}{A}$$

((where, A is an integer from 1 to M) and supplies them to the A phase/frequency detector.

In particular, when the M is 2, the controlling the oscillation frequency phase divides the divided voltage controlled oscillation frequency signal by ½ and supplies it the first phase/frequency detector and inverts a phase of a signal that divides the divided voltage controlled oscillation frequency signal by ½ and supplies it to the second phase/frequency detector; the controlling the reference frequency phase supplies the reference frequency signal to the first phase/frequency detector and inverts the phase of the reference frequency signal and supplies it to the second phase/frequency detector.

Other features and advantages of the present invention will become apparent to those skilled in the art from the following detailed description. It should be understood, however, that the detailed description and specific examples, while indicating preferred embodiments of the present invention, are given by way of illustration and not limitation. Many substitutions, changes and modifications within the scope of the present invention may be made without departing from the spirit thereof and the invention includes all such modifications.

What is claimed is:

1. A fractional-N frequency synthesizer improving noise characteristics, comprising:
    a reference oscillator that generates a reference frequency signal;
    a sigma-delta modulator that generates a desired decimal value based on the reference frequency signal;
    a divider that divides a voltage controlled oscillation frequency signal;
    first to M phase/frequency detectors that detect a difference in phase and frequency between the reference frequency signal and the divided voltage controlled oscillation frequency signal;
    first to M charge pumps that are connected to each of the phase/frequency detectors in series and charge or pump charge amount according to output signals from each of the phase/frequency detectors;
    a loop filter that controls amount of supplied current based on output signals from the charge pumps to filter low-pass frequency components;
    a voltage controlled oscillator that is oscillated in response to an output signal from the loop filter and generates the voltage controlled oscillation frequency signal; and
    a phase controller that divides the divided voltage controlled oscillation frequency signal by 1/M times, controls each phase thereof, and then supplies them to each of the first to M phase/frequency detectors.

2. The fractional-N frequency synthesizer according to claim 1, wherein the phase controller controls the phases of the reference frequency signals, respectively, and supplies them to each of the first to M phase/frequency detectors.

3. The fractional-N frequency synthesizer according to claim 2, wherein the phase controller controls each of the phases of the reference frequency signals to $$\frac{(A-1)360°}{A}$$

(where, A is an integer from 1 to M) and supplies them to the A phase/frequency detector.

4. The fractional-N frequency synthesizer according to claim 2, wherein when the M is 2, the phase controller includes:
   a flip flop circuit that divides the divided voltage controlled oscillation frequency signal by ½;
   a first inverter that inverts the phase of the reference frequency signal; and
   a second inverter that inverts the phase of the divided voltage controlled oscillation frequency signal by ½ by the flip flop circuit.

5. A fractional-N frequency synthesizing method improving noise characteristics, comprising:
   a) oscillating a reference frequency that generates a reference frequency signal;
   b) performing sigma-delta modulation that generates a desired decimal value based on the reference frequency signal;
   c) dividing a voltage controlled oscillation frequency signal;
   c1) controlling an oscillation frequency phase that divides the divided voltage controlled oscillation frequency signal by 1/M times, controls each phase thereof, and then supplies them to each of first to M phase/frequency detectors;
   d) detecting a difference in phase and frequency between the reference frequency signal and the divided voltage controlled oscillation frequency signal by the first to M phase/frequency detector;
   e) charging or pumping charge amount by first to M charge pumps, which are connected to each of the phase/frequency detectors in series, according to respective output signals from the phase/frequency detectors;
   f) filtering low-pass frequency component by controlling amount of supplied current by a loop filter, based on output signals from the charge pumps; and
   g) generating the voltage controlled oscillation frequency signal oscillated in response to an output signal from the loop filter by a voltage controlled oscillator.

6. The fractional-N frequency synthesizing method according to claim 5, wherein the step c1) further includes controlling a reference frequency phase that controls the phases of the reference frequency signals, respectively, and supplies them to each of the first to M phase/frequency detectors.

7. The fractional-N frequency synthesizing method according to claim 6, wherein the controlling of the reference frequency phase controls each of the phases of the reference frequency signals to $$\frac{(A-1)360°}{A}$$

(where, A is an integer from 1 to M) and supplies them to the A phase/frequency detector.

8. The fractional-N frequency synthesizing method according to claim 6, wherein when the M is 2, the controlling of the oscillation frequency phase divides the divided voltage controlled oscillation frequency signal by ½ and supplies it to the first phase/frequency detector, and inverts a phase of a signal that divides the divided voltage controlled oscillation frequency signal by ½ and supplies it to the second phase/frequency detector, and
   the controlling of the reference frequency phase supplies the reference frequency signal to the first phase/frequency detector, and inverts the phase of the reference frequency signal and supplies it to the second phase/frequency detector.

* * * * *